United States Patent
Mi et al.

(10) Patent No.: US 10,903,532 B2
(45) Date of Patent: Jan. 26, 2021

(54) FAULT TOLERANT VOLTAGE MEASUREMENT METHOD

(71) Applicant: THE REGENTS OF THE UNIVERSITY OF MICHIGAN, Ann Arbor, MI (US)

(72) Inventors: Chris Mi, Canton, MI (US); Bing Xia, Shanghai (CN)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 489 days.

(21) Appl. No.: 15/750,785

(22) PCT Filed: Aug. 4, 2016

(86) PCT No.: PCT/US2016/045480
§ 371 (c)(1),
(2) Date: Feb. 6, 2018

(87) PCT Pub. No.: WO2017/024105
PCT Pub. Date: Feb. 9, 2017

(65) Prior Publication Data
US 2020/0091562 A1 Mar. 19, 2020

Related U.S. Application Data

(60) Provisional application No. 62/201,652, filed on Aug. 6, 2015.

(51) Int. Cl.
*G01R 31/00* (2006.01)
*B60L 50/00* (2019.01)
(Continued)

(52) U.S. Cl.
CPC .......... *H01M 10/482* (2013.01); *B60L 50/64* (2019.02); *B60L 58/21* (2019.02);
(Continued)

(58) Field of Classification Search
CPC .......... H01M 10/425; H01M 10/4207; H01M 10/482; H01M 2010/4271;
(Continued)

(56) References Cited

U.S. PATENT DOCUMENTS

| 5,945,829 A | 8/1999 | Bertness |
| 6,983,212 B2 | 1/2006 | Burns |

(Continued)

FOREIGN PATENT DOCUMENTS

| CN | 101212072 A | 7/2008 |
| CN | 101243325 A | 8/2008 |

(Continued)

OTHER PUBLICATIONS

Benjamin J. Yurkovich, "Electrothermal Battery Pack Modeling and Simulation", A Thesis, Ohio State University, 2010.*

(Continued)

*Primary Examiner* — Alexander Satanovsky
(74) *Attorney, Agent, or Firm* — Harness, Dickey & Pierce, P.L.C.

(57) ABSTRACT

A fault tolerant voltage measurement method for battery management systems is proposed for reliable and prompt cell fault and sensor fault detection. The key of the method is that it correlates one voltage sensor reading with multiple cell voltages and vice versa. When a cell fault occurs, fault readings will be revealed by multiple voltage sensor readings. Similarly, when a sensor fault occurs, multiple cell voltages will be influenced. Compared with the traditional one-to-one correspondence voltage measurement, the proposed method increases the credibility of sensor/cell fault decisions. Furthermore, it does not increase the hardware cost, and is easy to be adopted in real applications.

15 Claims, 13 Drawing Sheets

(51) Int. Cl.
  *B60L 58/00* (2019.01)
  *H01M 10/00* (2006.01)
  *H01M 10/48* (2006.01)
  *G01R 31/396* (2019.01)
  *G01R 31/3835* (2019.01)
  *B60L 50/64* (2019.01)
  *B60L 58/21* (2019.01)
  *G01R 31/36* (2020.01)
  *H01M 10/42* (2006.01)

(52) U.S. Cl.
  CPC ..... *G01R 31/3648* (2013.01); *G01R 31/3835* (2019.01); *G01R 31/396* (2019.01); *H01M 10/425* (2013.01); *H01M 10/4207* (2013.01); *H01M 2010/4271* (2013.01); *H01M 2220/20* (2013.01)

(58) Field of Classification Search
  CPC ............. H01M 2220/20; G01R 31/396; G01R 31/3835; G01R 31/3648; G01R 31/392; G01R 35/00; B60L 50/64; B60L 58/21
  See application file for complete search history.

(56) References Cited

U.S. PATENT DOCUMENTS 7,573,238 B2   8/2009 Kawai
2008/0202830 A1   8/2008 Yamabe
2011/0121645 A1*  5/2011 Zhang .................. H02J 7/0018
                                                  307/9.1
2014/0152261 A1*  6/2014 Yamauchi ........... H01M 10/425
                                                  320/118
2018/0106869 A1*  4/2018 Gelso ............... G01R 19/16542

FOREIGN PATENT DOCUMENTS

| | | |
|---|---|---|
| CN | 101622547 A | 1/2010 |
| CN | 102263303 A | 11/2011 |
| CN | 102565663 A | 7/2012 |
| JP | 2007195272 A | 8/2007 |
| JP | 2008-079415 A | 4/2008 |
| JP | 2010-249793 A | 11/2010 |

OTHER PUBLICATIONS

Xia, B., et al., "A fault-tolerant voltage measurement method for series connected battery packs", Journal of Power Sources 308, Elsevier (2016), pp. 83-96.

International Search Report and Written Opinion of the International Searching issued in PCT/US2016/045480, dated Nov. 10, 2016; ISA/KR.

* cited by examiner

FAULT TOLERANT VOLTAGE MEASUREMENT METHOD

CROSS REFERENCE TO RELATED APPLICATIONS

This application is a U.S. National Phase Application under 35 U.S.C. 371 of International Application No. PCT/US2016/045480 filed on Aug. 4, 2016 and published in English as WO 2017/024105 A1 on Feb. 9, 2017. This application claims the benefit of U.S. Provisional Application No. 62/201,652 filed on Aug. 6, 2015. The entire disclosures of the above is applications are incorporated herein by reference.

FIELD

The present disclosure relates to a fault tolerant voltage measurement method.

BACKGROUND

Lithium ion batteries are widely applied in electric vehicle applications due to their considerable improvements in energy density and power density. However, this technology still demands many compromises be made in system level, among which safety is the primary concern. Multiple violent incidents reported all over the world hinder the fast growth of lithium battery in the market place. These incidents originate from various causes, but they all result in the worst scenario in which thermal runaway is triggered. Thermal runaway has been identified as a catastrophic failure of lithium battery systems and is typically induced by internal or external physical damage of the cell. The initial temperature-rise from a failure cell triggers the exothermic chemical reaction that propagates the temperature-rise among battery packs and eventually lead to fire. According to the post-accident reports, most of the incidents can be avoided or at least mitigated with proper and reliable management, which is also believed to be the key to the comprehensive development of lithium ion battery technology.

The management of onboard lithium ion batteries gives rise to battery management systems (BMS). The most fundamental task of a BMS is to ensure the safe working condition of batteries by monitoring voltage, current and temperature values. Among all these measurements, research shows that voltage is the most critical information because of its high sensitivity to common electrical faults: including short circuits, over charge and over discharge. Thus, it is necessary to enhance the safety level of electric vehicles with reliable and fault-tolerant voltage measurement.

Today's widely applied voltage measurement method uses individual voltage sensors, or measurement integrated circuits (ICs), to measure the voltage values of individual cells. This one-to-one corresponding ensures that the voltage of every single cell is monitored. To measure the voltages of a series string of batteries, instead of using one voltage measurement circuit for each of the cells, switches are typically applied to reduce cost in measurement circuits and analog to digital converters (ADC). The switches are turned on with pairs, such that the cell voltages in a string are updated one at a time sequentially. When any voltage reading shows abnormal values, the battery system will be stopped for protection purposes and mitigation methods will be employed.

It needs to be pointed out that sensors have their own reliability; in other words a voltage sensor in fault condition may lead to a false positive cell fault detection, however, the mitigation methods for these two types of faults differ significantly. In the case of cell faults, some immediate, costly or even dangerous mitigation methods should be taken, including cutting the power from battery pack in the middle of drives and informing the fire department; while in the case of sensor faults, more moderate mitigation methods can be applied, such as switching the vehicle into limp home mode and pushing a request for battery pack maintenance. Thus, it is critical to distinguish between sensor faults and cell faults in order to apply proper mitigation and ensure reliable operation of electric vehicles.

Abundant researches have been conducted to investigate the methods to detect and isolate sensor faults. The most widely applied method is hardware redundancy, where measurements of the same signal are given by multiple sensors. Clearly, this sensor fault detection feature is equipped at the cost of additional hardware expense and more complex system which may be more prone to failure. Analytical redundancy is then proposed as opposed to hardware redundancy, which utilizes the output from mathematical models of the system and compare the output with sensor measurements. This method does not require additional hardware, however, it is complex to maintain the robustness of the model given uncertainties, disturbances and various failure modes of the given system.

Given the inherent disadvantages of the redundancy-based sensor fault diagnostic methods, this disclosure introduces a fault-tolerant voltage measurement method that can distinguish between a sensor fault and a battery cell fault without any additional sensors. Instead of measuring the voltage values of individual cells, the voltage sensors are used to measure the voltage sum of multiple cells. When a cell fault occurs, its corresponding voltage sensors will indicate the fault at the same time, thereby identifying the fault.

This section provides background information related to the present disclosure which is not necessarily prior art.

SUMMARY

This section provides a general summary of the disclosure, and is not a comprehensive disclosure of its full scope or all of its features.

A method is presented for detecting a fault condition in a string of battery cells arranged in series. The method includes: grouping N battery cells into L groups of cells, where each group of cells is comprised of a combination of two or more battery cells and each combination of battery cells is comprised of battery cells which differ from the other combination of battery cells; measuring voltage across each group in the L groups of battery cells using M voltage sensors, such that each voltage sensor of the M voltage sensors measures voltage across a different group of the L groups of battery cells; and determining, by a controller, a fault condition in the string of battery cells using the voltage measurements for each group in the L groups of battery cells. More specifically, one or more relationships are defined between cell voltage for each cell in the N battery cells and the voltage measurements for each group in the L groups of battery cells and current cell voltages for each battery cell is determined using the relationships and the voltage measurements for each group in the L groups of battery cells.

In one aspect, current cell voltages are determined using matrix multiplication. To do so, the cell voltages for each cell in the N battery cells are represented as a matrix, C; voltage measurements for each group in the L groups of battery cell are represented as a matrix, V; and the mapping between each voltage measurement and the battery cells whose sum corresponds to the voltage measurement is in the form of a matrix, A. In this way, the relationship between the cell voltages for each cell in the N battery cells and the voltage measurements for each group in the L groups of battery cells are expressed as V=AC.

In one embodiment, a fault with one of the N battery cells is identified by solving $C_{fault}=C-C_{normal}=A^{-1}V-C_{normal}$, where $C_{normal}$ is cell voltage values in normal working condition and $C_{fault}$ is the impact of the fault conditions.

Similarly, a fault with one of the M voltage sensors is identified by $V_{fault}=V-V_{normal}=V-AC_{normal}$, where $V_{normal}$ is a normal sensor reading and $V_{fault}$ the impact of the fault conditions.

In another aspect, a battery management system is provided for use in a vehicle. The system includes N battery cells connected in series, where the N battery cells are grouped into L groups of cells, each group of cells having a combination of two or more battery cells and each combination of battery cells is comprised of battery cells which differ from the other combinations of battery cells; M voltage sensors electrically coupled across the N battery cells, where each voltage sensor of the M voltage sensors is configured to measure voltage across a different group of the L groups of battery cells; and a controller electrically coupled to each of the M voltage sensors. In response to voltage measures from the M voltage sensors, the controller determines a fault condition using the voltage measurements from each group in the L groups of battery cells.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
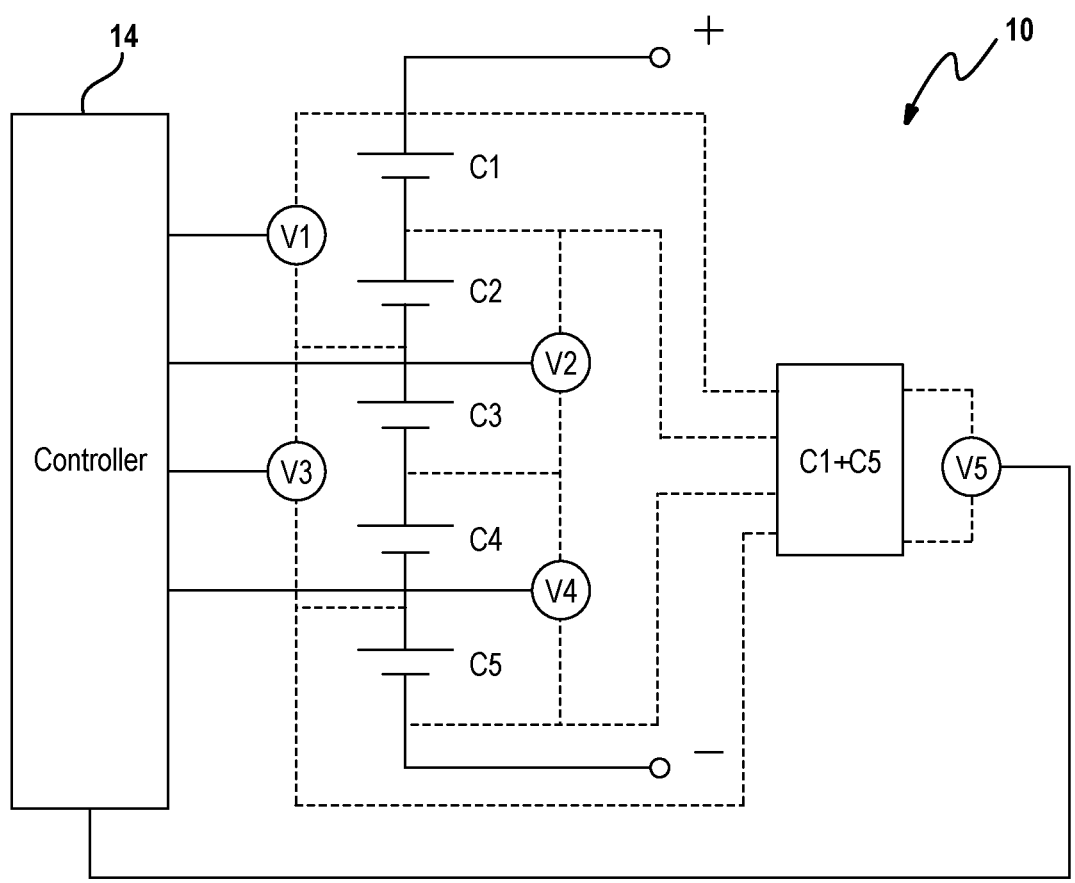
FIG. 1 is a schematic of a proposed voltage measurement topology.

FIG. 1 depicts an example embodiment of a proposed fault-tolerant battery management system 10. The battery management system 10 includes a plurality of battery cells C1-C5 connected in series, a plurality of voltage sensors V1-V5 and at least one controller 14. The N battery cells are grouped into L groups of cells, such that each group of cells has a combination of two or more battery cells. In this embodiment, the five battery cells (i.e., N=5) are grouped in four groups of cells (i.e., L=4). It is noted that each combination of battery cells is comprised of battery cells which differ from the other combinations of battery cells. It is readily understood that more or less battery cells as well as different cells in each group (e.g., five groups with two, two, three, four, five cells in each group) are within the scope of this disclosure. In any case, the number of groups should be equal to the total number of battery cells.

The voltage sensors V1-V5 are electrically coupled across the battery cells C1-C5. Specifically, each voltage sensor is configured to measure voltage across a different group of battery cells. The controller 14 is electrically coupled to each of the voltage sensors and monitors and determines fault conditions with either a battery cell or a voltage sensor as will be further described below.

In this topology, each voltage sensor measures the voltage sum of two cells, including $V_5$, which measures the voltage sum of $C_1$ and $C_5$. The schematic in FIG. 1 ensures that the voltage of each cell is associated with the measurements of two sensors. For example, assume the voltage for each cell in FIG. 1 is 3 V. The voltage value of $C_2$ is included in the measurements of $V_1$ and $V_2$. When $C_2$ is in external short circuit condition, its terminal voltage drops to zero, and its abnormal voltage value will be revealed by $V_1$ and $V_2$ as they both drop from 6 V to 3 V. On the other hand, when a sensor fault occurs, it can be identified immediately in that it is impossible for only one of the sensed voltage values to change. For example, if $V_1$ through $V_5$ show 6 V, and suddenly only $V_2$ changes from 6 V to 0 V, $V_2$ is certainly in fault condition, otherwise the voltage values of $C_1$ and $C_4$ will be 6 V, and $C_5$'s will be 0 V. The latter condition involves the same overcharge level on $C_1$ and $C_4$ and an external circuit fault on $C_5$, which are almost impossible to occur at the same time.

In one embodiment, this relation between sensor measurements V and cell voltage values C can be expressed as:

$$V=AC \qquad (1)$$

where V is an n×1 matrix that includes all the readings from the voltage sensors, C is an n×1 matrix that includes all the voltage values for the cells in the series connection, and A is n×n matrix that correlates V with C.

For the case of a one-to-one correspondence between the voltage sensors and cell voltages, Eq. (1) can be written as equation (2) below. The A matrix of equation (2) demonstrates that each cell voltage corresponds to one voltage sensor. In other words, when a cell fault occurs, only its corresponding voltage sensor can be used to indicate the cell's status. This is also true when the C matrix is calculated from the V matrix, as shown in equation (3), in which each sensor reading correlates to only one cell voltage. When a sensor is in fault condition, it is hard to distinguish sensor failure from cell failure.

$$\begin{bmatrix} V_1 \\ V_2 \\ V_3 \\ V_4 \\ V_5 \end{bmatrix} = \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix} \begin{bmatrix} C_1 \\ C_2 \\ C_3 \\ C_4 \\ C_5 \end{bmatrix} \quad (2)$$

$$\begin{bmatrix} C_1 \\ C_2 \\ C_3 \\ C_4 \\ C_5 \end{bmatrix} = \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix} \begin{bmatrix} V_1 \\ V_2 \\ V_3 \\ V_4 \\ V_5 \end{bmatrix} \quad (3)$$

$$\begin{bmatrix} V_1 \\ V_2 \\ V_3 \\ V_4 \\ V_5 \end{bmatrix} = \begin{bmatrix} 1 & 1 & 0 & 0 & 0 \\ 0 & 1 & 1 & 0 & 0 \\ 0 & 0 & 1 & 1 & 0 \\ 0 & 0 & 0 & 1 & 1 \\ 1 & 0 & 0 & 0 & 1 \end{bmatrix} \begin{bmatrix} C_1 \\ C_2 \\ C_3 \\ C_4 \\ C_5 \end{bmatrix} \quad (4)$$

$$\begin{bmatrix} C_1 \\ C_2 \\ C_3 \\ C_4 \\ C_5 \end{bmatrix} = \begin{bmatrix} \frac{1}{2} & -\frac{1}{2} & \frac{1}{2} & -\frac{1}{2} & \frac{1}{2} \\ \frac{1}{2} & \frac{1}{2} & -\frac{1}{2} & \frac{1}{2} & -\frac{1}{2} \\ -\frac{1}{2} & \frac{1}{2} & \frac{1}{2} & -\frac{1}{2} & \frac{1}{2} \\ \frac{1}{2} & -\frac{1}{2} & \frac{1}{2} & \frac{1}{2} & -\frac{1}{2} \\ -\frac{1}{2} & \frac{1}{2} & -\frac{1}{2} & \frac{1}{2} & \frac{1}{2} \end{bmatrix} \begin{bmatrix} V_1 \\ V_2 \\ V_3 \\ V_4 \\ V_5 \end{bmatrix} \quad (5)$$

With reference to FIG. 1, the A matrix of the proposed fault detection method is shown in (4). By observing the columns of the A matrix, it can be found that the example, the two '1's in the third column $[0\ 1\ 1\ 0\ 0]^T$ indicate that the voltage value of $C_3$ is included in both $V_2$ and $V_3$. This feature ensures that when a cell failure occurs, it will be revealed by two sensors. The probability of two sensors exhibiting the same sensor fault at the same time is a low probability, therefore cell failure be determined with high confidence. Similarly, $A^{-1}$ in (5) indicates that when a sensor fault occurs, the abnormal change in the voltage sensor is to be reflected by multiple calculated cell values. In addition, some of the changes in the cell voltage values are positive to the sensor change and some of the changes in cell voltage values are negative to the sensor change. This feature further increases the sensor fault diagnostic's credibility because simultaneous voltage changes in different directions with the same amplitude at the same time are extremely abnormal in series connected packs.

Figure 2:
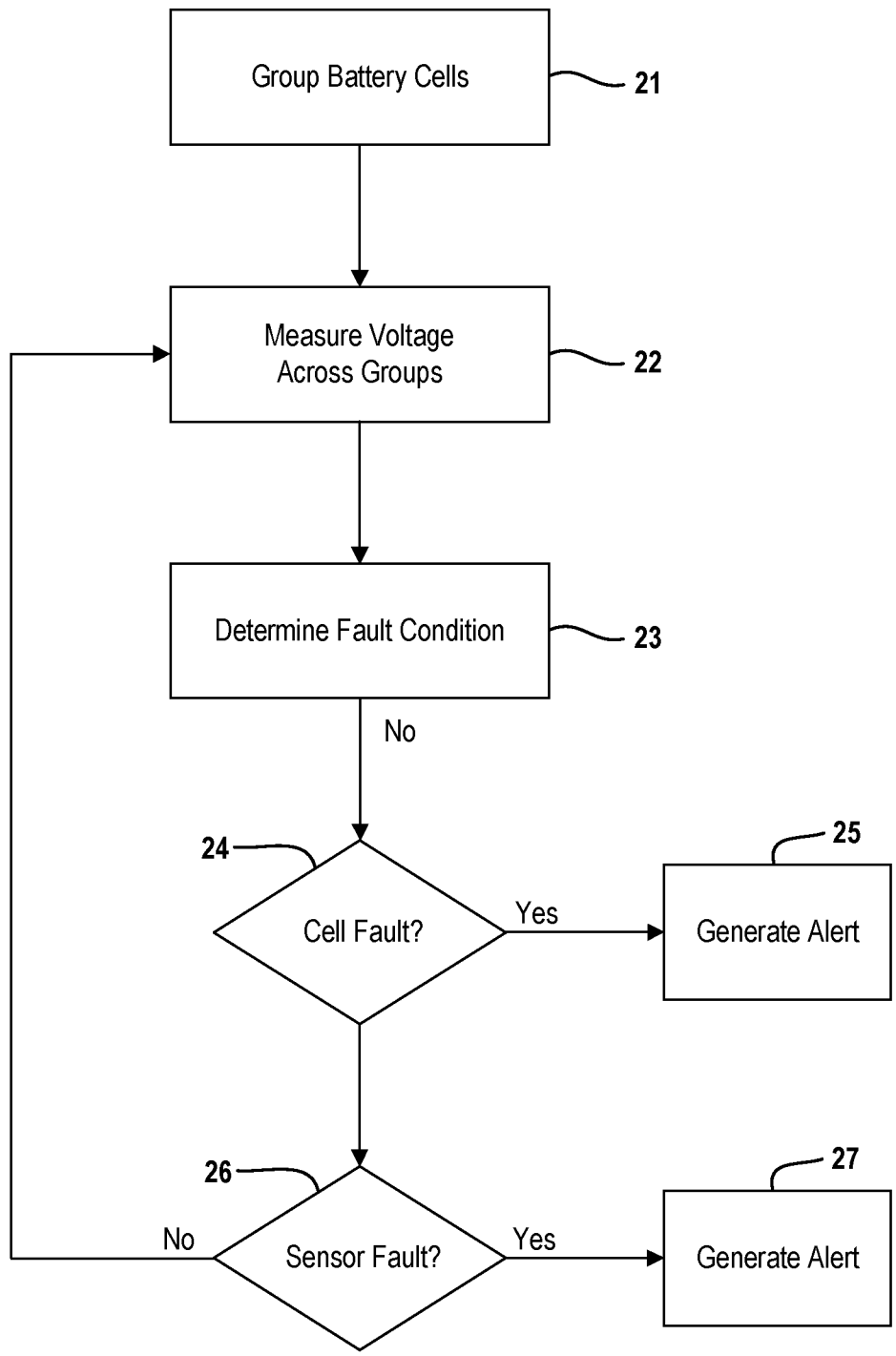
FIG. 2 is a flowchart depicting an example fault detection method within the context of the voltage measurement system.

Based on these observations, an example fault detection method is further described in relation to FIG. 2. Given a string of battery cells connected in series, the N battery cells are first grouped at 21 into L groups of cells, where each group of cells is comprised of a combination of two or more battery cells and each combination of battery cells is comprised of battery cells which differ from the other combinations of battery cells. Voltage sensors are then configured to measure the voltage across each group of battery cells, such that each voltage sensor measures voltage across a different group of the L groups of battery cells.

Voltage across each group in the L groups of battery cells is measured at 22 using the voltage sensors. Next, a fault condition is determined at 23 using the voltage measures across each group of battery cells. For example, if a cell fails, it will be revealed in voltage measures from two different sensors. Depending on which two voltage measures change, the particular cell can be identified. In an example embodiment, cell voltages are determined using matrix multiplication as will be further described below. If a cell fault is revealed at 24, then an alert can be generated at 25 by the battery management system 10. In one example, a visual alert may be presented on a display, for example in a console of a vehicle. It may be a generic alert or an alert that identifies the particular faulty cell. The alert may also be an audible alert, a tactile alert or combinations thereof.

Additionally, if a sensor fails, it will be revealed by abnormal cell voltage increases and decreases following a specific pattern, in accordance with the columns of (5). Depending on the unique change pattern, the particular sensor can be identified. In an example embodiment, faulty sensors are determined using matrix multiplication as will be further described below. If a sensor failure is revealed at 24, then an alert can be generated at 27 by the battery management system 10. It is understood that the alert may be in the same form or different form than the alert for a faulty cell.

In the event there is neither a faulty cell or a faulty sensor, the process is repeated periodically (e.g., every minute, every hour, etc.). It is understood that the duration of the interval will depend upon the application. For example, in the context of an electric vehicle, the process may be repeated every second. It is also envisioned that the monitoring of the battery cells may be ongoing or only occur during operation of the system being monitored, for example while the electric vehicle is being driven. It is to be understood that only the relevant steps of the methodology are discussed in relation to FIG. 2, but that other software-implemented instructions may be needed to control and manage the overall operation of the system.

In an example embodiment, the fault cell can be located based on the locations of sensors showing abnormal values. If the cell failure is modeled as the sum of normal cell voltages and the effect of fault conditions, it can be expressed as $$C = C_{normal} + C_{fault} \quad (6)$$

where $C_{normal}$ is the cell voltage values in normal working condition, and $C_{fault}$ is the impact of the fault conditions. $C_{fault}$ can be isolated by, $$C_{fault} = C - C_{normal} = A^{-1} V - C_{normal} \quad (7)$$

where V is the voltage readings after the fault occurs and $C_{normal}$ is the cell voltages in normal conditions. When $C_{fault}$ is determined, the indices of cells in fault condition are found and their influence on normal voltage values is also determined. In this way, one can identify a fault with one or more battery cells in the string of cells.

Likewise, the sensor fault location can be determined according to the indices of cells with abnormal voltage variations. If the sensor failure is modeled as the sum of the sensor reading under normal condition and the effect of fault conditions, it can be expressed as $$V = V_{normal} + V_{fault} \quad (8)$$

where $V_{normal}$ is the normal reading and $V_{fault}$ is the impact of the fault conditions. $V_{fault}$ can be isolated by $$V_{fault} = V - V_{normal} = V - AC_{normal} \quad (9)$$

When $V_{fault}$ is determined, the index of the sensor in fault condition can be found and its influence on normal sensor readings is determined. In this way, one can identify a fault with one of the voltage sensors.

A simulation is set up to test the viability of the proposed fault-tolerant voltage measurement method. A SIMSCAPE model is built for a battery pack consisting of five battery cells connected in series. In order to demonstrate the robustness of the method in dynamic situation, the urban dynamometer driving schedule (UDDS) cycle is applied to the battery pack when the faults are induced.

An external short circuit fault on $C_3$ is induced at 300 s by reducing $C_3$ to 2 V. The simulation results are shown in FIG. 3A-3D. It needs to be noted that the reduction in voltage is assigned qualitatively and is only used to demonstrate the viability of the proposed method. At 300 s, the readings of $V_2$ and $V_3$ drop by 2 V, indicating a sudden 2 V voltage drop in the overlap of $V_2$ and $V_3$. Clearly, $C_3$ is the overlap and it is demonstrated by the calculated cell terminal voltages.

Figure 3A:
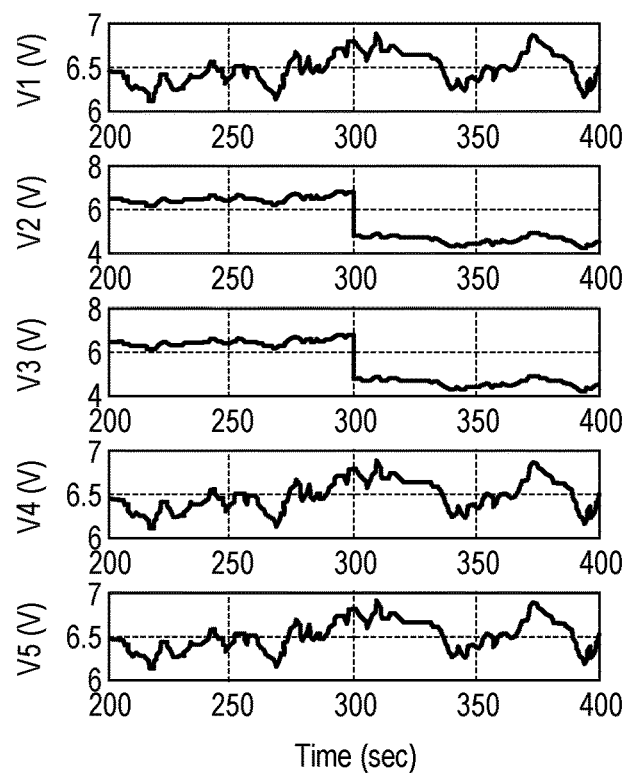
FIGS. 3A-3D are graphs showing sensor readings for each sensor, calculated cell voltages for each cell, sensor fault signals for each sensor and cell fault signals for each cell, respectively, during a simulation in which C3 short circuits.
Figure 3B:
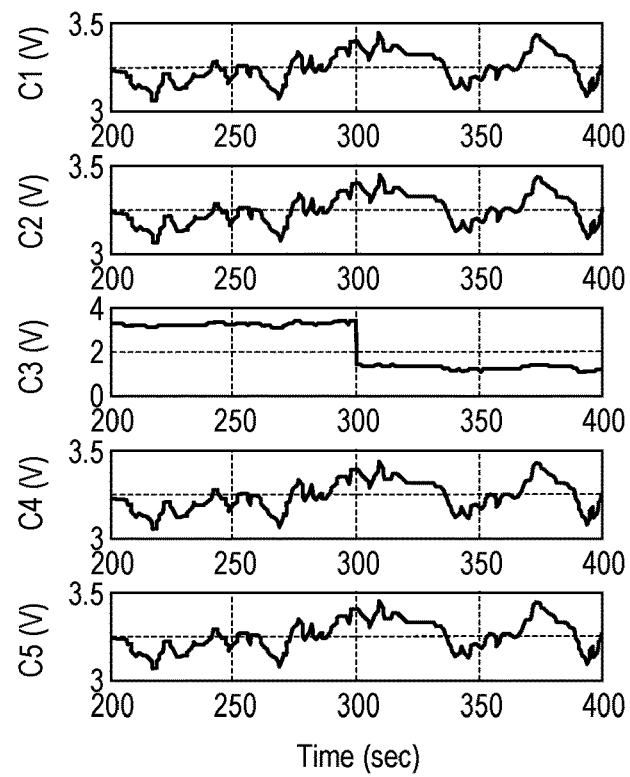
Figure 3C:
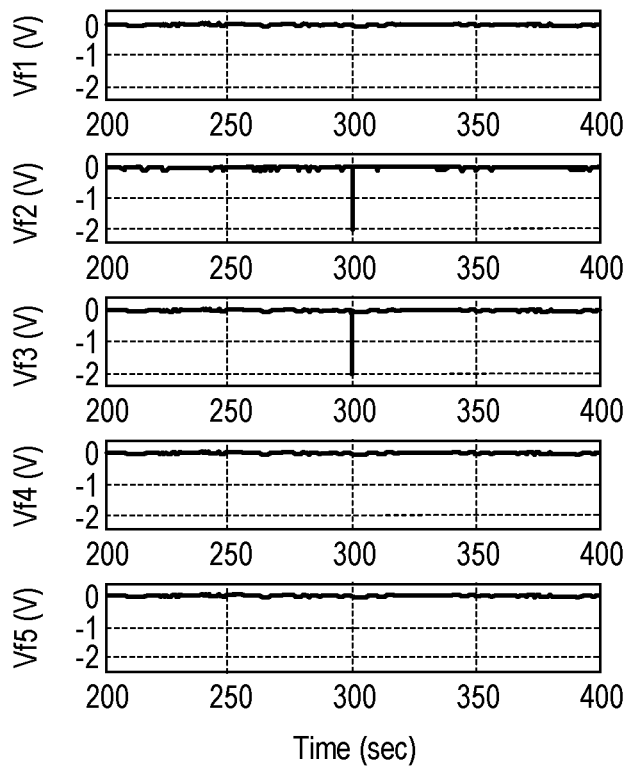
Figure 3D:
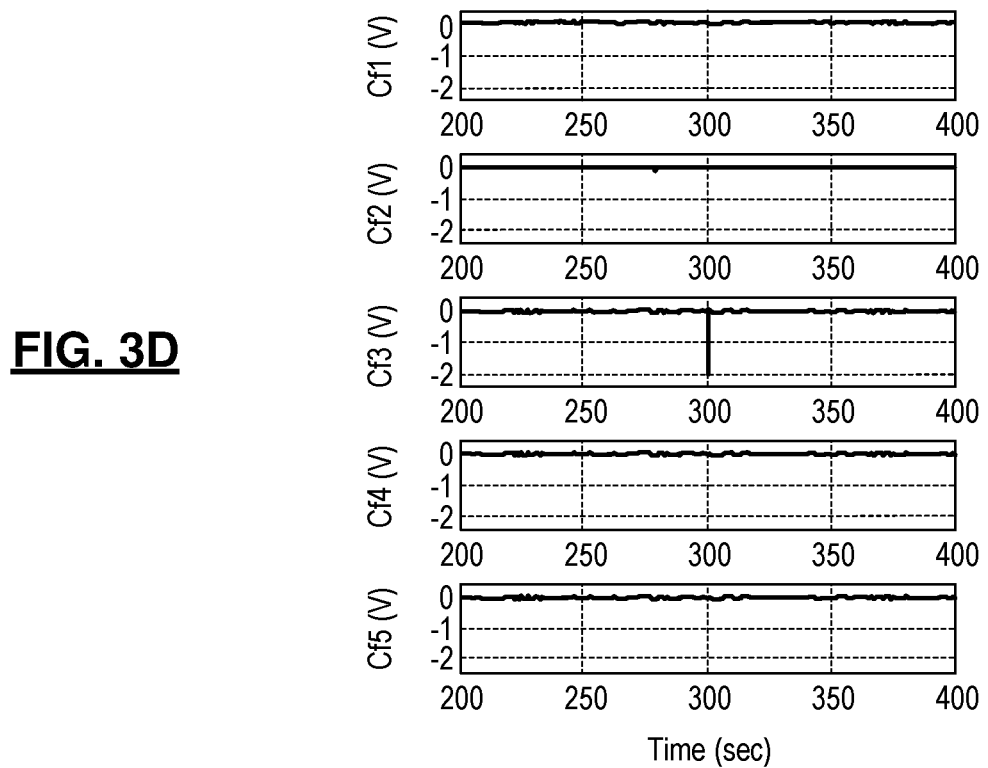
Figure 4A:
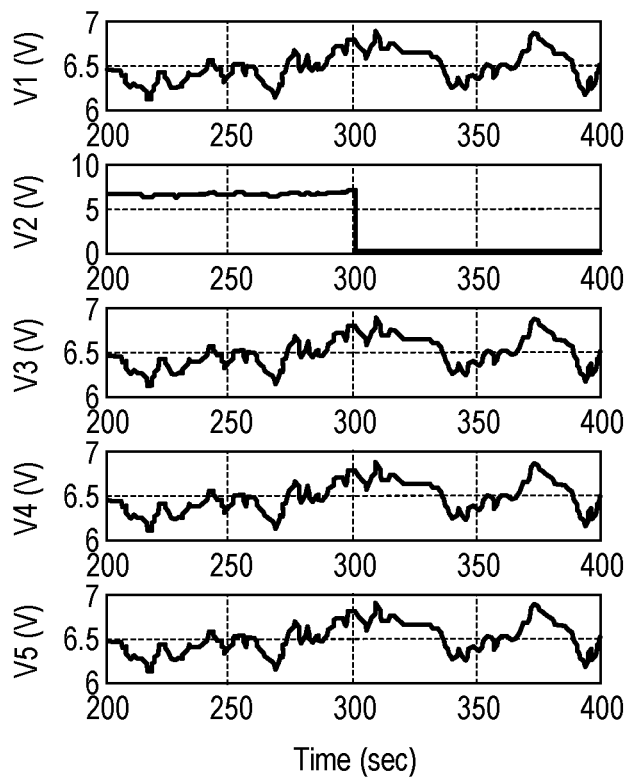
FIGS. 4A-4D are graphs showing sensor readings for each sensor, calculated cell voltages for each cell, sensor fault signals for each sensor and cell fault signals for each cell, respectively, during a simulation in which sensor V2 is faulty.
Figure 4B:
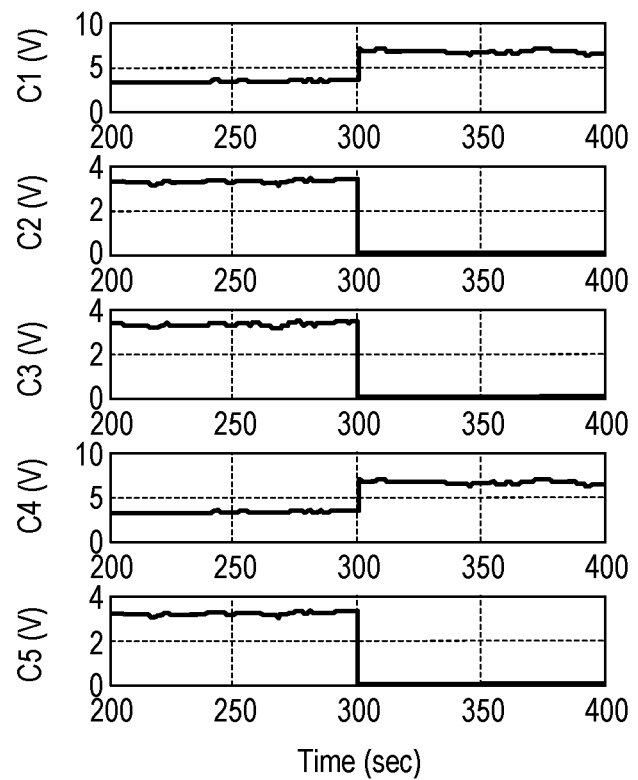
Figure 4C:
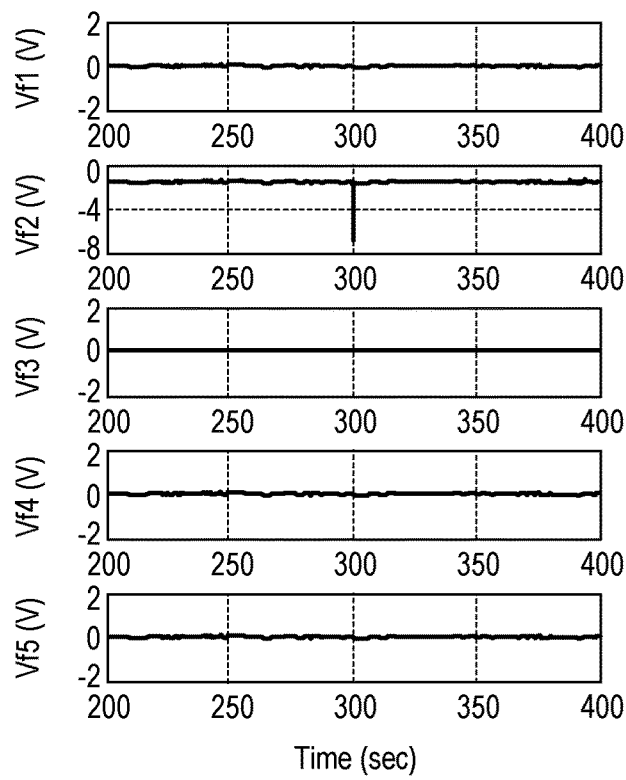
Figure 4D:
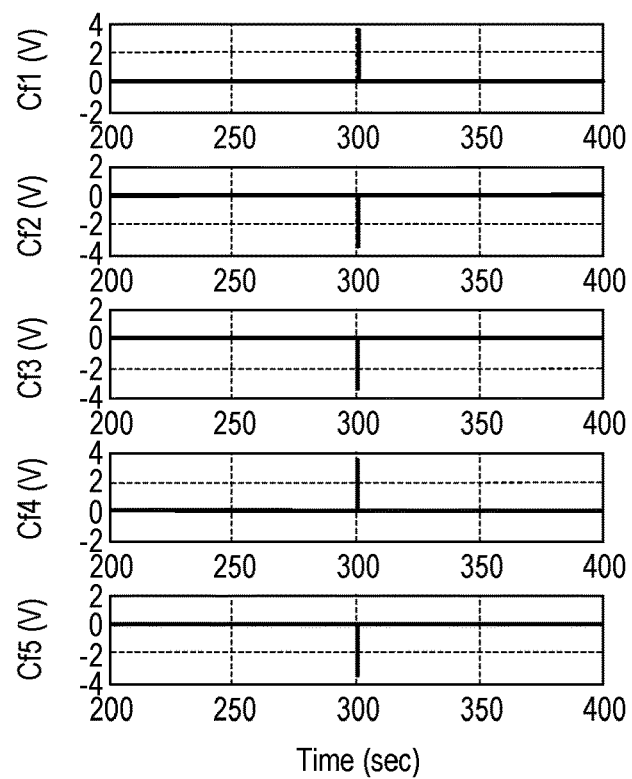

The same conclusion can be drawn by comparing $V_{fault}$ and $C_{fault}$ signals provided in FIGS. 3C and 3D. $V_{fault}$ indicates that two sensor faults on both $V_2$ and $V_3$ at 300 s, while $C_{fault}$ flags a sudden 2 V voltage drop on $C_3$. There are two possible explanations: 1) Two sensor faults happen at 300 s and these lead to a wrong voltage calculation on $C_3$; or 2) $C_3$ is in external circuit fault and this leads to abnormal readings on both $V_2$ and $V_3$. Clearly, the latter explanation is more convincing because it is less likely for two sensors to go wrong at the same sampling period.

Similarly, the sensor fault is simulated by setting $V_2$ to zero after 300 s. The simulation results are shown in FIG. 4A-4D. With wrong reading from $V_2$ after 300 s, the five voltage values all turns abnormal. The offset of the cell voltages follows the trend shown by the second column of (5), which leading the system to flag a sensor fault to $V_2$ at 300 s, instead of five abnormal cell faults.

Figure 5A:
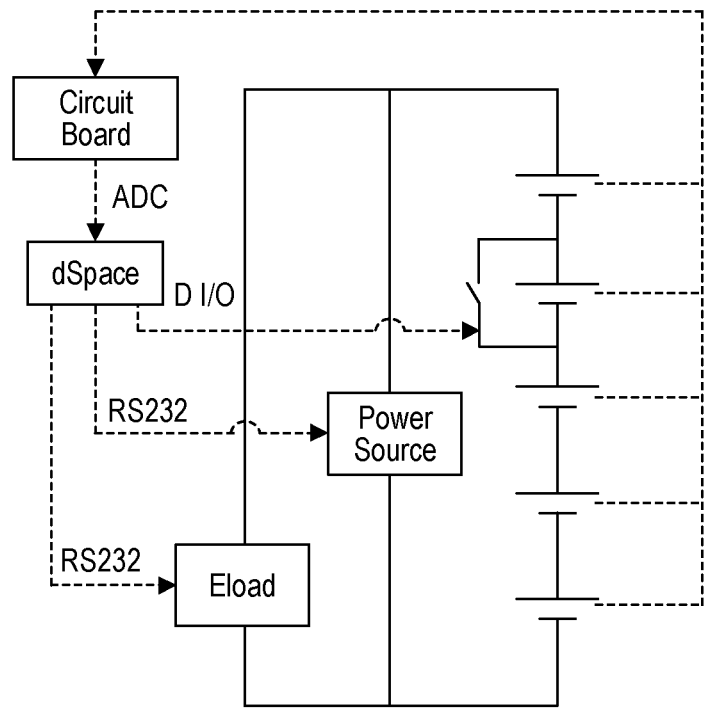
FIGS. 5A and 5B are a schematic of an experimental setup and a circuit realization of voltage sum of separate cells, respectively.

Experiments are also set up to demonstrate the concept of the proposed method. A circuit board is built based on the diagram in FIG. 1. The schematic of the experimental setup is shown in FIG. 5A. The voltage sum of two separate cells in series can be realized in hardware by the circuit given in FIG. 5B. The positive and negative terminals of the first cell are connected to $V_{1+}$ and $V_{1-}$. The second separate cell is connected to $V_{2+}$ and $V_{2-}$. By properly choosing the resistors, i.e., $R = R_1 = R_2 = R_3 = R_4 = R_f$ and $R_h = R_g R/(R_g + R)$, the output will be the inverse of the sum of the two voltage values, i.e., $V_0 = -(V_{1+} - V_{1-} - V_{2+} - V_{2-})$. It needs to be noted that the only added cost of the circuit compared to commercial differential amplifiers is an additional pair of resistors, i.e., $R_3$ and $R_4$, which is negligible.

Figure 6A:
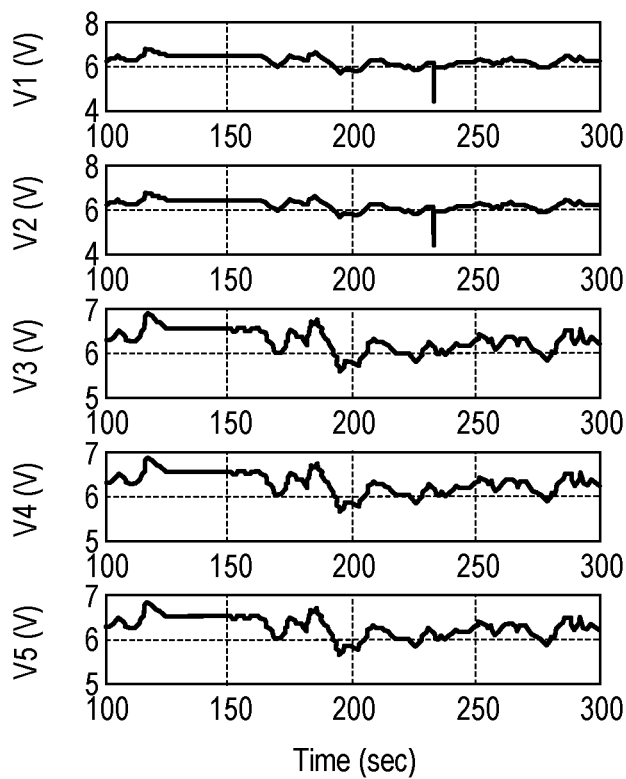
FIGS. 6A-6D are graphs showing sensor readings for each sensor, calculated cell voltages for each cell, sensor fault signals for each sensor and cell fault signals for each cell, respectively, during an experiment in which C2 short circuits at 232.8 seconds.
Figure 6B:
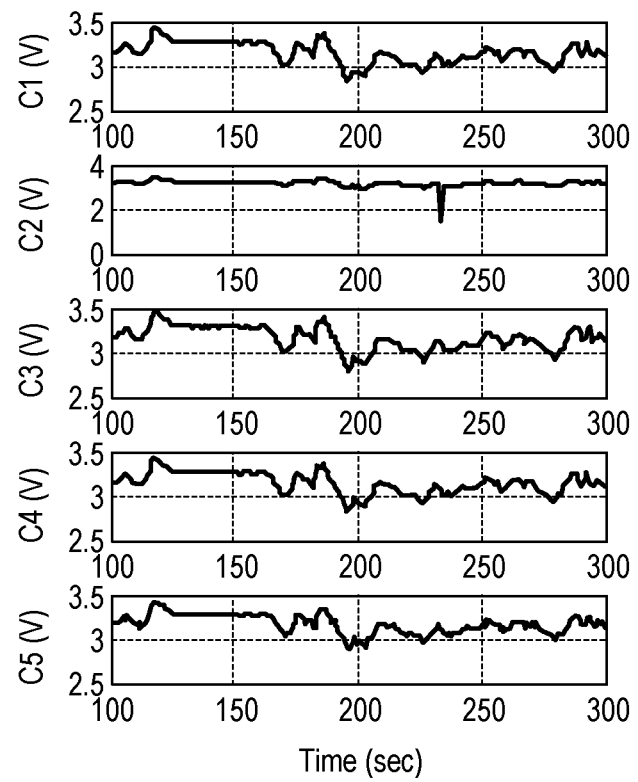
Figure 6C:
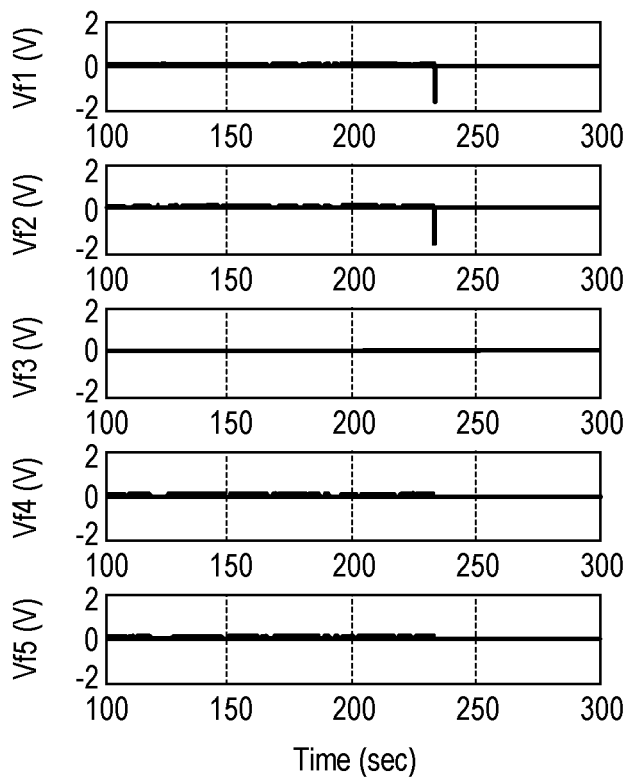
Figure 6D:
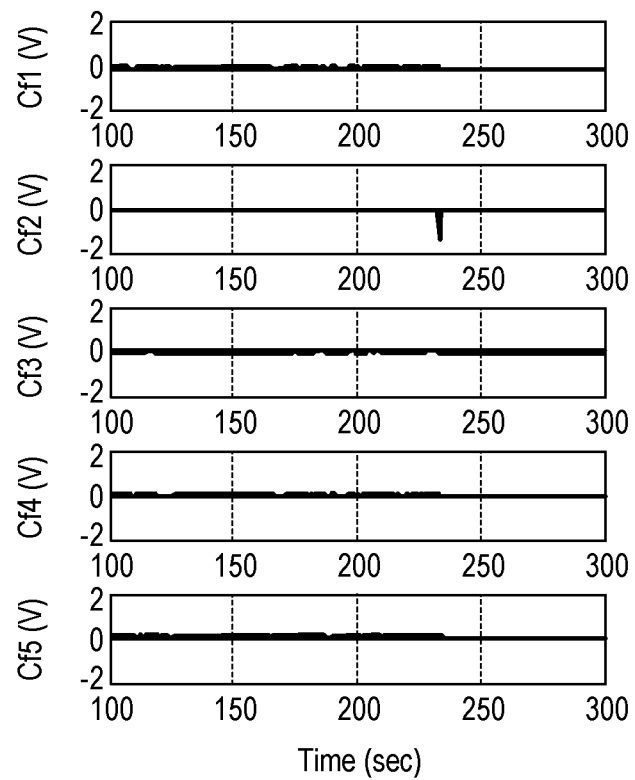

An external short circuit fault is induced by shorting $C_2$ with a relay. The resistance of the wires and relay is 0.87Ω. The external short circuit lasts for 1 s and then the relay is opened. Experiment results in FIG. 6A show that $V_1$ and $V_2$ indicate abnormal voltage changes at 232.8 s and lasting for 1 second. The calculated cell voltage values in FIG. 6B demonstrate that $C_2$ shows abnormal voltage values at 232.8 seconds lasting for 1 second. In this situation, it is obvious that the probability of two sensors experiencing the same sensor fault at the same time is much lower than that of one cell undergoing an external short circuit. The fault signal in FIG. 6D indicates an abnormal voltage drop in $C_2$. Thus, a cell fault is determined.

Figure 7A:
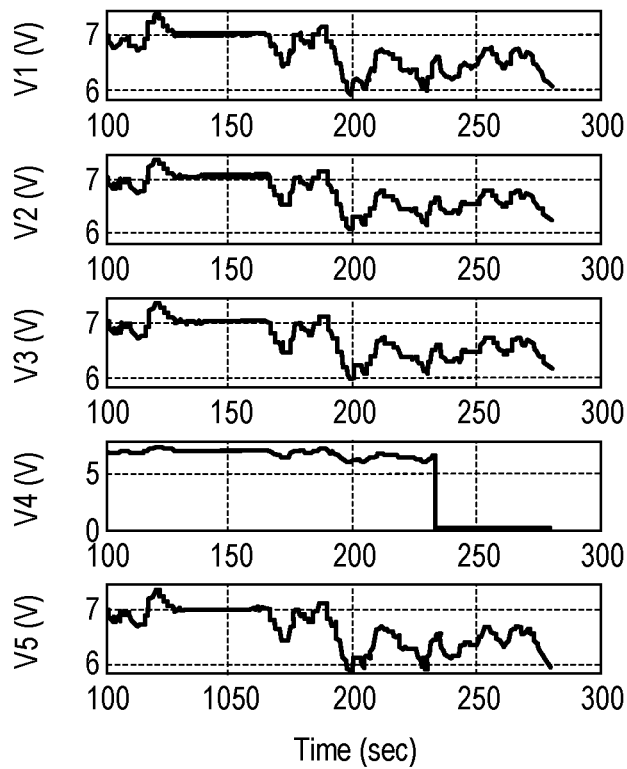
FIGS. 7A-7D are graphs showing sensor readings for each sensor, calculated cell voltages for each cell, sensor fault signals for each sensor and cell fault signals for each cell, respectively, during an experiment in which sensor V4 is faulty.
Figure 7B:
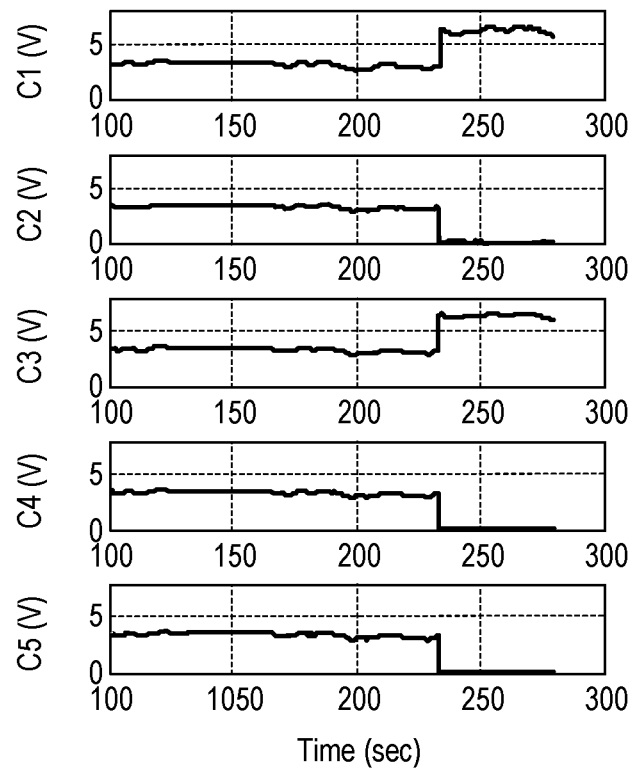
Figure 7C:
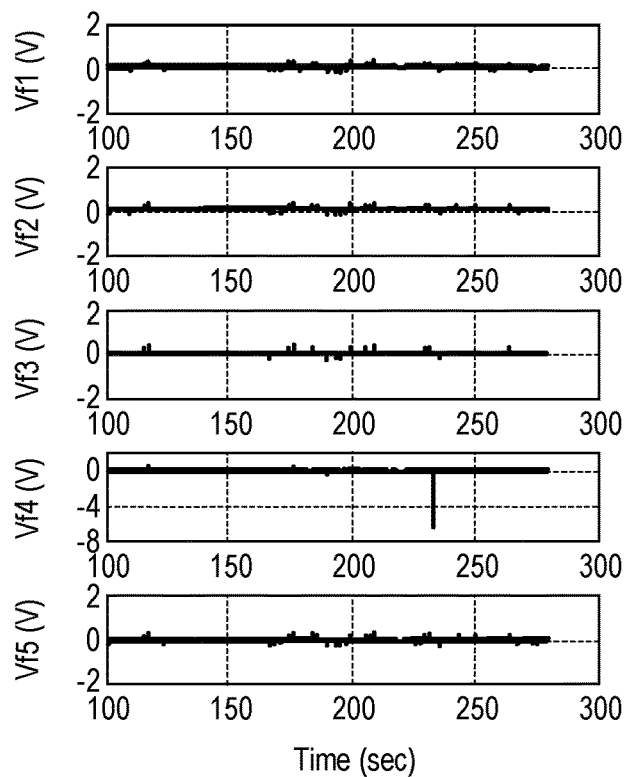
Figure 7D:
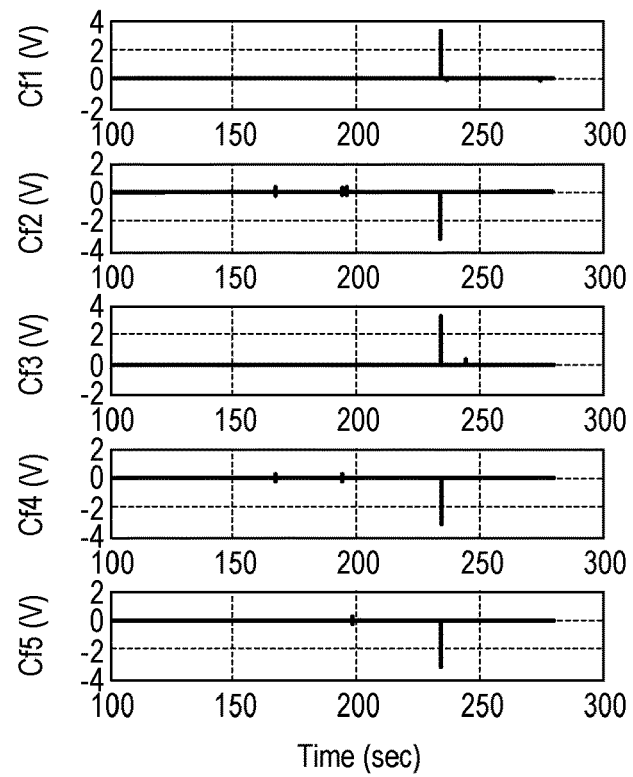

The sensor fault is induced by disconnecting the jump wire in the sensing path of $V_4$ on the bottom side of the circuit board. Experiment results in FIG. 7B shows that the calculated cell voltages demonstrate abnormal values at 233.1 seconds. The voltage values of $C_1$ and $C_3$ are increased, while those of $C_2$, $C_4$ and $C_5$ are decreased. These changes are of same magnitude and the signs follow those of the fourth column of (5). As a result, the sensor fault on $V_4$ is determined.

The proposed voltage measurement method can be extended to a battery pack with n cells in series, in which each voltage sensor measures the voltage sum of k cells (k<n). It needs to be noted that, given the measurement circuit in 5B, the n cells can be nonconsecutive, as demonstrated in (10) and (11). The number of cells in each group can also be different. It is interesting to see that the A matrix for the prevailing voltage measurement method is an identity matrix. Therefore, mathematically, the proposed method includes any case with invertible non-identity A matrix.

Earlier, the case of n=5 and consecutive k=2 is demonstrated. However, the combination of n=5 and k=2 may not be the optimal solution for the battery packs of electric vehicles, whose n may exceed several tens or even hundreds.

In the following section, the choice of n and k values are analyzed in terms of cost, fault detection reliability and noise level increase, and the condition for valid measurement topology is presented.

$$\begin{bmatrix} V_1 \\ V_2 \\ V_3 \\ V_4 \\ V_5 \end{bmatrix} = \begin{bmatrix} 1 & 0 & 1 & 0 & 0 \\ 0 & 1 & 0 & 1 & 0 \\ 0 & 0 & 1 & 0 & 1 \\ 1 & 0 & 0 & 1 & 0 \\ 0 & 1 & 0 & 0 & 1 \end{bmatrix} \begin{bmatrix} C_1 \\ C_2 \\ C_3 \\ C_4 \\ C_5 \end{bmatrix} \quad (10)$$

$$\begin{bmatrix} C_1 \\ C_2 \\ C_3 \\ C_4 \\ C_5 \end{bmatrix} = \begin{bmatrix} \frac{1}{2} & -\frac{1}{2} & -\frac{1}{2} & \frac{1}{2} & \frac{1}{2} \\ \frac{1}{2} & \frac{1}{2} & -\frac{1}{2} & -\frac{1}{2} & \frac{1}{2} \\ \frac{1}{2} & \frac{1}{2} & \frac{1}{2} & -\frac{1}{2} & -\frac{1}{2} \\ -\frac{1}{2} & \frac{1}{2} & \frac{1}{2} & \frac{1}{2} & -\frac{1}{2} \\ -\frac{1}{2} & -\frac{1}{2} & \frac{1}{2} & \frac{1}{2} & \frac{1}{2} \end{bmatrix} \begin{bmatrix} V_1 \\ V_2 \\ V_3 \\ V_4 \\ V_5 \end{bmatrix} \quad (11)$$

The voltage measurement system can be modeled as a series connected system, where each voltage sensor is one of the subsystems. Only when all the subsystems are functioning well, the whole system is in normal condition. If any of the subsystems fails, the whole system fails and a fault is flagged.

The reliability of a voltage sensor is modeled as a device with constant failure rate, as shown in $$R_i(t) = e^{-\lambda t}, \lambda > 0 \quad (12)$$

where R is the reliability of a voltage sensor, λ is the constant failure rate and all the voltage sensors are assumed to have the same failure rate.

When the sensor fault does not occur, the proposed method works the same as traditional one-to-one correspondence measurement topology does.

However, when the sensor fault occurs, the traditional method flags a cell fault, but the proposed method flags sensor fault unless all the associated sensors are in fault condition within the same sampling period. The confidence level of the sensor fault detection from the proposed method can be expressed as $$CL = 2 - P(k \text{ sensors fail} | 1 \text{ sensor fails}) = \qquad (13)$$

$$1 - \frac{\prod_{i=1}^{k-1} \int_{t=0}^{Ts} f_i(t)dt}{\int_{t=0}^{Ts} f_j(t)dt} = 1 - \prod_{i=1}^{k-1} \int_{t=0}^{Ts}(1-e^{-\lambda t})dt$$

where CL is the confidence level of the sensor fault detection ranging from 0 to 1, Ts is the sampling period of the voltage measurements, $f_i(t)$ is the failure density of voltage sensor i and j is an arbitrary number within 1 and k. The relation between $f_i(t)$ and $R_i(t)$ is given by P. O'Connor et al's "Practical Reliability Engineering".

$$R_i(t) + F_i(t) = 1 \qquad (14)$$

$$f(t) = \frac{d}{dt}F(t) \qquad (15)$$

where $F_i(t)$ is the unreliability of voltage sensor i.

There are two key points that need to be pointed out from (13). First, the larger the k is, the more confidence the BMS has in the sensor fault detection. In the traditional voltage measurement topology k is 1. This leads the CL value drop to zero when the sensor fault occurs, which indicates that the traditional topology gives a false cell fault detection whenever a sensor fault occurs. As for the proposed method, k is larger than 1, which significantly increases the CL value. This is the key to improve the fault detection confidence; and secondly, the smaller the Ts is, the more confidence in the fault detection. This is due to the monotonic increase of the integral of failure intensity. In practice, it refers to the fact that it is less possible for multiple sensors to fail within a shorter period of time.

Figure 8:
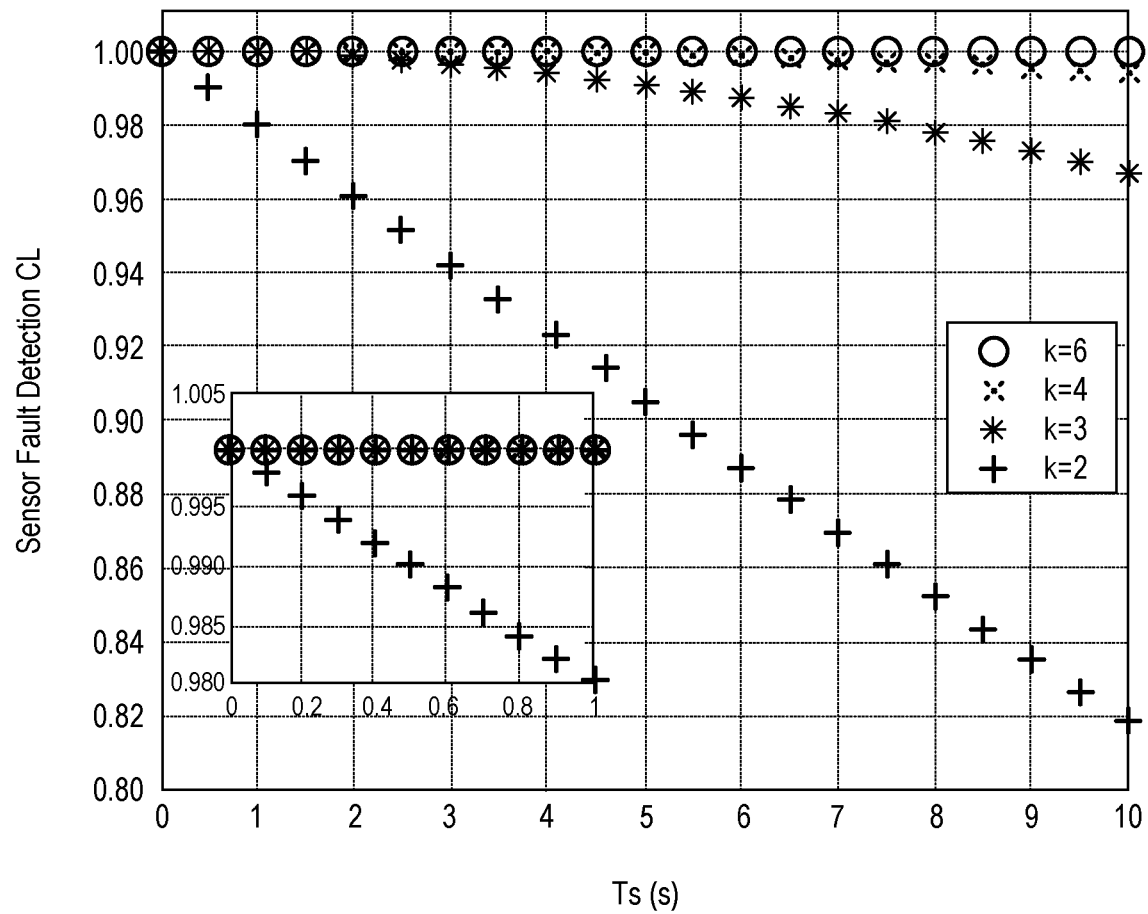
FIG. 8 is a graph showing fault detection reliability increases as k increases and Ts decreases (($\lambda$=0.02/s)

The above two points are illustrated in FIG. 8, where the CL values are plotted with different sampling times and different k's. With a fixed k, the detection confidence decreases as Ts increases. With a fixed Ts, the detection confidence increases as k increases. Since the typical sampling period for BMS is smaller than 1 second, the insert in FIG. 8 gives detailed figure for Ts smaller than 1 second. The result shows that, when the sensor fault occurs, the proposed method can eliminate more than 98% of the false cell fault detection.

If the voltage measurement of a voltage sensor is modeled as a normal distribution with mean value μ and standard deviation σ. The variance of the sensor i is denoted as (16). By the variance sum rule, shown in (17) the noise levels of the voltage measurements may increase as k increases. As the case of (5), the cell voltage values involve the noises from all five voltage sensors.

$$\text{Var}(V_i) = \sigma_{V_i}^2 \qquad (16)$$

$$\text{Var}(aV_i + bV_j) = a^2\sigma_{V_i}^2 + b^2\sigma_{V_j}^2 \qquad (17)$$

It can be proved that the rows of $A^{-1}$ matrix rotate one entry to the right as the row number increases by one. This fact indicates that the entries of the rows simply change their positions when row number changes, as shown in (5), but the sum of square of the entries in each row are the same. If the noise level is regarded as the standard deviation of the measurement, and the noise level is assumed to be proportional to the measurement range, the general expression for the noise level of the cell voltages can be expressed as $$NL = k\sigma\sqrt{\Sigma_{j=1}^n e_{ij}^2}, \text{ for any } i \leq n \qquad (18)$$

where NL represents the noise level of the cell voltage calculation, and σ is the noise level for one of the voltage sensors applied, and $e_{ij}$ is the jth entry in ith row of $A^{-1}$. The noise level gain ($G_{NL}$) gives the ratio of noise level of the system with (n,k) compared with that of the sensing topology with k=1, and can be expressed as (19). As a special case, $G_{NL} = 1$ when k=1.

$$G_{NL} = k\sqrt{\Sigma_{j=1}^n e_{ij}^2}, \text{ for any } i \leq n \qquad (19)$$

Since the battery cells are typically treated by the maximum number of 16, the $G_{NL}$ values and their corresponding (n,k) pairs are given in Table 1. It can be concluded from the table that there is no consistent trend for $G_{NL}$ as k or n increases. However, for n≤16: when k≤4, $G_{NL}$ increases as n increases; when k≤5, $G_{NL}$ increases as k value increases. Among all the combinations of n and k, (3, 2) has the lowest $G_{NL}$ and is most favorable in the case of the lowest noise level.

TABLE 1

| $G_{NL}$ | | n | | | | | | | | | | | | | |
|---|---|---|---|---|---|---|---|---|---|---|---|---|---|---|---|
| | | 3 | 4 | 5 | 6 | 7 | 8 | 9 | 10 | 11 | 12 | 13 | 14 | 15 | 16 |
| k | 2 | 1.7 | | 2.2 | | 2.7 | | 3.0 | | 3.3 | | 3.6 | | 3.9 | |
| | 3 | | 2.7 | 3.3 | | 3.6 | 4.1 | | 4.4 | 4.8 | | 5.0 | 5.4 | | 5.6 |
| | 4 | | | 3.6 | | 4.8 | 5.0 | | 5.9 | | 6.1 | | 6.9 | | |
| | 5 | | | | 4.7 | 6.6 | 6.9 | 6.2 | | 6.4 | 8.5 | 8.8 | 7.7 | | 7.8 |
| | 6 | | | | | 5.6 | | | 7.7 | | 7.8 | | | | |
| | 7 | | | | | 6.6 | 10.4 | 10.2 | 10.3 | 12.0 | 9.1 | | 9.2 | 13.9 |
| | 8 | | | | | | 7.6 | | 12.8 | | 14.0 | | 10.5 | | |
| | 9 | | | | | | | 8.5 | 14.9 | | 13.7 | 13.8 | | 17.9 |
| | 10 | | | | | | | | 9.5 | | 16.6 | | | | |
| | 11 | | | | | | | | | 10.5 | 19.8 | 19.7 | 18.8 | 17.2 |
| | 12 | | | | | | | | | | 11.5 | | | | |
| | 13 | | | | | | | | | | | 12.5 | 25.1 | 24.1 |
| | 14 | | | | | | | | | | | | 13.5 | |
| | 15 | | | | | | | | | | | | | 14.5 |

Figure 5B:
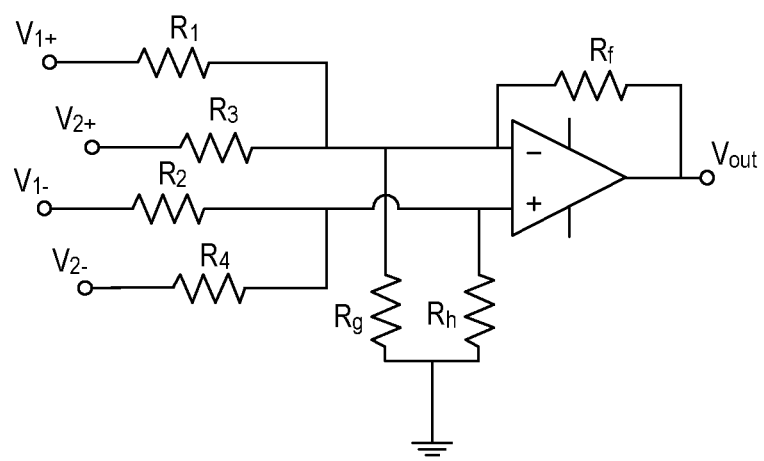

Although not limited thereto, sequential measurement is usually utilized to reduce hardware cost. With this measurement method, the number of switches required for n cells in series is 2n because two switches are needed at a time to deliver voltage signal to the sampling circuit. However, if voltage sum from two nonconsecutive cells is sampled each time, four switches are needed at a time, as shown in FIG. 5B. In other words, the cost of switches goes up as the number of nonconsecutive cells increases, which is not favorable. Therefore in the following analysis, only measurement topology with consecutive cells are discussed. it is understood that the broader aspects of this disclosure are applicable to non-sequential measurements as well.

The sequential update for the prevailing sensor topology uses zero order hold between samples. An example of n=3 and k=2 is used to demonstrate its principle. If the sequential update is applied to the proposed method, the update formula for $C_1$ can be expressed as $$C_1[m]=e_{1,1} V_1[m-2]+e_{1,2} V_2[m-1]+e_{1,3} V_3[m]$$

$$C_1[m+1]=e_{1,1}V_1[m+1]+e_{1,2}V_2[m-1]+e_{1,3}V_3[m]$$

$$C_1[m+2]=e_{1,1}V_1[m+1]+e_{1,2}V_2[m+2]+e_{1,3}V_3[m]$$

$$C_1[m+3]=e_{1,1}V_1[m+1]+e_{1,2}V_2[m+2]+e_{1,3}V_3[m+3] \quad (20)$$

where $C_1$ [m] is the voltage value of $C_1$ at time m, $V_i$ [m] is the updated voltage measurement of sensor i at time m, and $e_{1,1}$=0.5, $e_{1,2}$=0.5, and $e_{1,3}$=0.5, for n=3 and k=2. In this sequential update algorithm, one $V_i$ is updated after every sampling interval, as a result, $C_1$ is updated after every sampling interval.

A simulation is run based on the update algorithm, where the following assumptions are made: a) the three batteries are consistant; and b) the terminal voltages of all the batteries jump from 3.0 V to 3.1 V at time m+1.

Figure 9A:
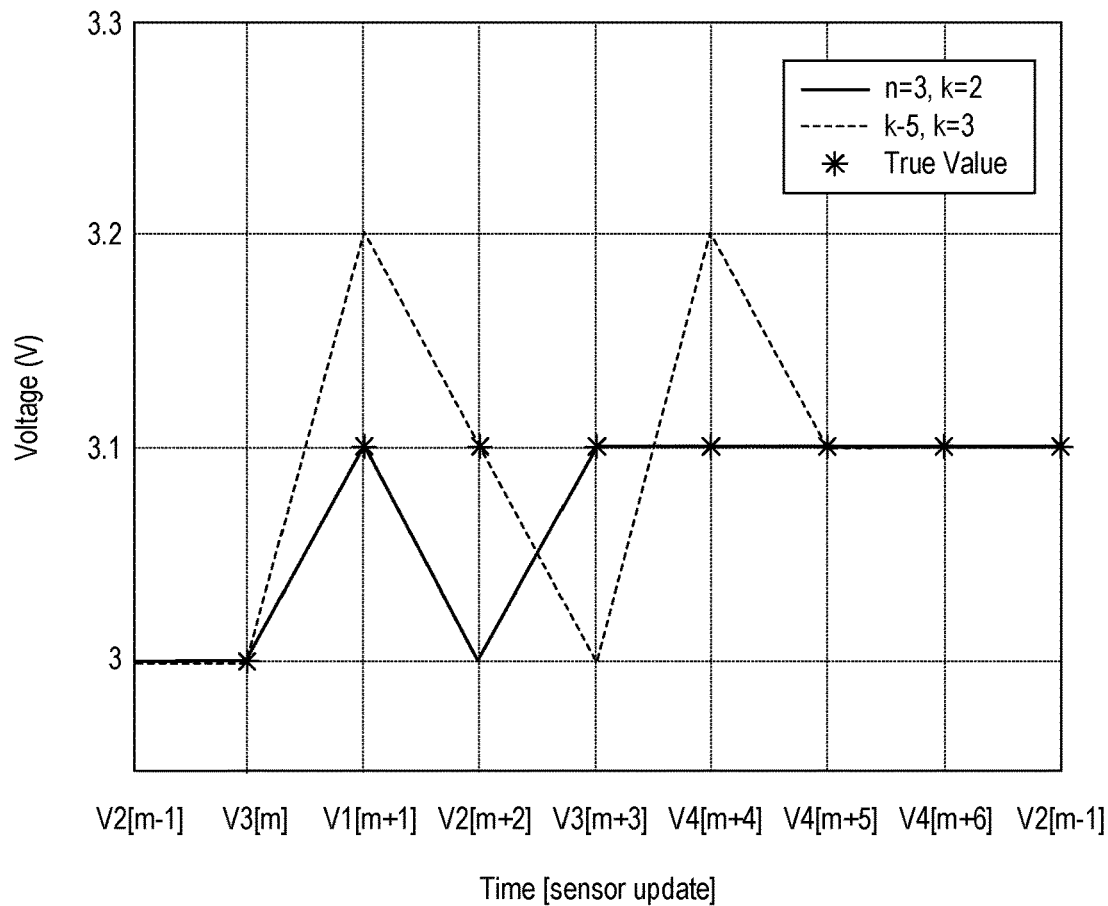
FIG. 9A is a graph showing voltage ripples are found in sequential measurement.

Based on the simulation, a voltage ripple is observed after the step input, as shown in FIG. 9A. This voltage ripple can be explained when (20) is rewritten as (21).

$$C_1[m+1]-C_1[m]=e_{1,1}\{V_1[m+1]V_1[m-2]\}$$

$$C_1[m+2]-C_1[m+1]=e_{1,2}\{V^2[m+2]-V_2[m-1]\}$$

$$C_1[m+3]-C_1[m+2]=e_{1,3}\{V_3[m+3]-V_3[m]\} \quad (21)$$

As can be calculated from (21), from time step m to m+1, $C_1$ is increased by 0.1 V, from m+1 to m+2, $C_1$ is increased by 0.1 V, and from m+2 to m+3, $C_1$ is increased by 0.1V. The ripple in FIG. 8A results from the latter two changes. Indeed, the effect of the ripple can be larger given larger n and k, as shown in FIG. 9A, where the case of n=5 and k=3 is also demonstrated.

Figure 9B:
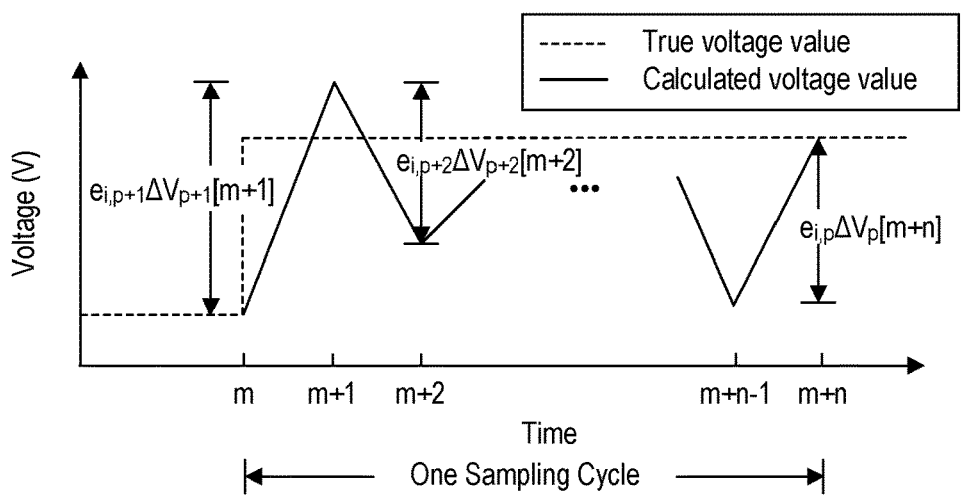
FIG. 9B is a graph showing the general sequential update process.

The simulation result shows that it takes a whole sampling cycle to update every sensor measurement, and the voltage ripples appear during the update process. The general update process is illustrated in FIG. 9B qualitatively. Since the final terminal voltage settles at the right value, all the voltage ripples add up to the voltage step increase, i.e., $$C_i[m+n]=C_i[m]+\Sigma_{j=1}^n e_{i,ind(p+j,n)}\{V_{ind(p+j,n)}[m+j]-V_{ind(p+j,n)}[m+j-n]\} \quad (22)$$

where ind(p+j, n) is the rotating sensor index, $$ind(x, n) = \begin{cases} n, & rem(x, n) = 0 \\ rem(x, n), & otherwise \end{cases} \quad (23)$$

where rem(x, n) is the remainder of $$\frac{x}{n}.$$

Equation (22) shows that sensor p+1 senses the voltage step increase first and each succeeding voltage sensors is updated one per time step, until sensor p is updated and the cell voltage converges to the right value. The whole process takes n times steps, which equal one full sampling cycle.

It can be found these voltage ripples increase measurement noise significantly. As expected from FIG. 9B, the noise is proportional to the $$\frac{k-1}{k}$$

times voltage change in sensors and thus increases linearly with k−1. Given 100 mV instant terminal voltage change for one cell in dynamic operations, the sequential measurement will lead to 100 mV measurement error for n=5 and k=3, which is not desirable.

The other impact of the sequential measurement is on fault detection and isolation. Since all the voltage sensors are updated sequentially, the fault signals become a time series of signals. For example, as the case of FIG. 3A, the sensor voltages will not all change at 300 s. Due to sequential sensor updates, the change of $V_3$ will lag that of $V_2$ for one time step. With this impact, the fault detection and isolation need to be adapted from examining signal changes at one time to examining signal changes within a sampling period. In addition, as discussed earlier, the voltage change in one sensor reading is regarded as sensor fault, which is always the proposed method to sequential measurement requires much more work in signal processing, more memory space and more computation.

Given the limitation in the extension of the proposed topology to sequential measurement, a conversion methodology is provided to modify sequential measurement to simultaneous measurement in practical application.

Assume a battery module consists of M cells in series, and N modules form a whole pack. Within one module, a set of sequential measurement circuit is used to measure the voltages. Thus, a total N ADC channels and N measurement circuits are utilized. In the traditional arrangement, the cell voltage is updated sequentially within one module, which leads to undesired sequential update.

The traditional arrangement can be modified by the following procedure. First, the NM cells in the pack are regrouped into M new modules with N cells in each module. Next, for one time step, all the N ADC channels are used to measure the cell voltages within one module, and the cell voltages in other modules are updated sequentially.

In this way, the sequential cell voltage measurement in traditional topology is adapted to its equivalent simultaneous cell voltage measurement topology, with module voltage sequentially updated.

Not all combinations of n's and k's give valid A matrices. In some cases, the constructed A matrix is not invertible and thus the cell voltages cannot be obtained from sensor readings. One of the examples is n=6 and k=2. In order to increase the adaptability of the method, it is necessary to investigate the condition that gives invertible A matrices.

The A matrix can be formulated mathematically as follows,
a) A is an n×n matrix.
b) The first row consists of k consecutive '1's followed by (n−k) consecutive '0's, 2≤k<n.
c) The $m^{th}$ row is obtained by rotating every entry of the $(m-1)^{th}$ row to right by one position, and put the last entry of the $(m-1)^{th}$ row to the first entry of the mth row 2≤m≤n.

An example A matrix with n=5 and k=2 is given in (4). The final result is that n and k should be relatively prime, so that the associate A matrix is invertible. This statement is proved in two steps given below.

Step 1: If n and k are not relatively prime, the determinant of A, denoted as det(A), is zero.

Assume k=ae, n=be, where a<b and a, b, e ∈ N
If the $m^{th}$ of A is denoted as row(m),
Thus $\Sigma_{m=0}^{b-1}$ row(1+me)=$\Sigma_{m=0}^{b-1}$ row(2+me)= ... =$\Sigma_{m=0}^{b-1}$row(e+me)
Hence det(A)=0.

Step 2: If n and k are relative prime, det(A) is nonzero. A matrix can be written in the general form as shown in (24). If each row is subtracted by its proceeding row, except the last row, without varying the determinant, A matrix is modified into (25). The modified matrix is denoted as B, and its entries are denoted as $b_{i,j}$, where i is the row number and j is the column number.

Next the Leibniz formula is applied to determine det(A). The Leibniz formula expresses the determinant of square matrices with permutation of matrix entries, as (26).

$$\begin{array}{c} \text{row}(1) \\ \text{row}(2) \\ \vdots \\ \vdots \\ \text{row}(n-k) \\ \text{row}(n-k+1) \\ \vdots \\ \vdots \\ \text{row}(n-1) \\ \text{row}(n) \end{array} \begin{bmatrix} \overbrace{1 \quad 0 \cdots \cdots 0}^{k \text{ entries}} & \overbrace{-1 \quad 0 \cdots \cdots 0}^{(n-k) \text{ entries}} \\ 0 \quad 1 \quad 0 \cdots \cdots 0 & -1 \quad 0 \cdots 0 \\ \vdots & \vdots \\ 0 \cdots \cdots 0 \quad 1 \quad 0 \cdots \cdots 0 \quad -1 \\ -1 \quad 0 \cdots \cdots 0 \quad 1 \quad 0 \cdots \cdots 0 \\ \vdots & \vdots \\ 0 \cdots 0 \quad -1 \quad 0 \cdots \cdots 0 \quad 1 \quad 0 \\ \underbrace{1 \cdots \cdots 1}_{(k-1) \text{ '1's}} \quad \underbrace{0 \cdots \cdots \cdots 0}_{(n-k) \text{ '0's}} \quad 1 \end{bmatrix}$$ (24)

$$\det(A) = \Sigma_{\sigma \in S_n} \text{sgn}(\sigma) \prod_{i=1}^{n} a_{i,\sigma(i)}$$ (25)

where $S_n$ is the set of all permutations of 1,2, ..., n, σ is one of the permutations within $S_n$. The sgn(σ) function is +1 for σ=σ₀=[1,2, ..., n]. If a involves odd number of pairwise exchanges from σ₀ sgn(σ) is −1. If σ involves even number of pairwise exchanges from σ₀, sgn(σ) is +1.

Here lists two key facts of the Leibniz formula, 1) If $a_{ij}$ is one of the terms in the product term $\Pi_{i-1}^{n} a_{i,\sigma(i)}$, then any other entry in either row i or column j of A will not appear in the same product. In other words, in each of the product term, a row number or column number should appear exactly once. 2) If any of the terms in one product is '0', then the whole product is zero.

It is important to note that there are n! combinations of product terms for an n×n matrix is treated, the many '0's are of great help to simplify the problem, since any product term involves '0' will end up with zero. Thus, only the products with all nonzero entries contributes to the final summation.

There are k nonzero entries in row(n), including $b_{n,1}$, $b_{n,2}$, ..., $b_{n,k-1}$ and $b_{n,n}$. The following steps demonstrate a procedure to find the products with all nonzero entries. All of the products start from a term in row(n). 1) $b_{n,n}$ is picked to form the first product. Thus no other entries from row(n) or column(n) can be picked in the same product term. It needs to be noted that there are only two terms in each row except row(n) in B. The choice of $b_{n,n}$ leaves only one choice of row(n−k), because the '−1' in row(n−k) is in column(n), thus $b_{n-k,n-k}$ has to be picked in the same product term, otherwise no entry from row(n−k) can be picked. If the remainder of $$\frac{n-2k}{n}$$

is expressed as rem(n−2k, n), the choice of $b_{n-k,n-k}$ blocks the '−1' in row(rem(n−2k,n)), and $b_{rem(n-2k,n)rem(n-2k,n)}$ has to be picked. According to the proof given in Appendix B, if n and k are relatively prime, rem(n−mk,n) covers all the integers 1,2,3, ..., n−1 for n−1. It indicates that,
i) All the row numbers and column numbers appears exactly once.
ii) All the '−1's do not appear in the first product starting with $b_{nn}$.
iii) All the '1's along the diagonal of B have to be chosen in the first product starting with $b_{n,n}$.

Hence, the first product is $b_{1,1}b_{2,2}b_{3,3} \ldots b_{n,n}$. The sgn(σ) function is evaluated as "1". The product starting with $b_{nn}$ is 1.

2) Since k≥2, $b_{n,1}$ should be '1'. In this step, $b_{n,1}$ is picked as the term from row(n) to form the second product. Clearly, $b_{n,1}$ blocks '1' from row(1) and '−1' from row(n−k+1). In this case, $b_{1,1+k}$ and $b_{n-k+1,n-k+1}$ has to be chosen in the second product. The procedure how every term in the product is chosen is given in (27).

$$b_{n,1} \Rightarrow \begin{cases} b_{1,1+k} & \Rightarrow b_{1+k,rem(1+2k,n)} & \Rightarrow \ldots \Rightarrow b_{n-k,n} \\ b_{rem(1-k,n),rem(1-k,n)} & \Rightarrow b_{rem(1-2k,n),rem(1-2k,n)} & \Rightarrow \ldots \Rightarrow b_{k,k} \end{cases}$$ (27)

The off-diagonal terms in the second product are '−1's except $b_{n,1}$ is '1'. The choice of all the '−1's can be viewed as changing some of entry choices of the first product obtained in step 1, as shown in Table 3.

The row index of step 1) terms and step 2) terms in Table 2 are the same. If there are p terms different between step 2) and step 1, there are (p−1) terms involved in the '1' to '−1' shift (exclude $b_{n,n}$ to $b_{n,1}$). The pairwise exchange number of the column indices from step 1) to step 2) is (p−1). Since all the other diagonal terms remains to be '1', the product in step 2) is sgn($\sigma_{p-1}$)(−1)$^{p-1}$. If p−1 is even, sgn($\sigma_{p-1}$)=1, (−1)$^{p-1}$=1, the product is 1. If p−1 is odd, sgn($\sigma_{p-1}$)=−1, (−1)$^{p-1}$=−1, the product is also 1.

Hence the product starting with $b_{n,1}$ is 1.

TABLE 2

| Off-diagonal terms in step 2) | Value | Corresponding terms in step 1) | Value |
|---|---|---|---|
| $b_{1,\,1+k}$ | −1 | $b_{1,\,1}$ | 1 |
| $b_{1+k,\,rem(1+2k,\,n)}$ | −1 | $b_{1+k,\,1+k}$ | 1 |
| . | −1 | . | 1 |
| . |  | . |  |
| . |  | . |  |
| $b_{n-k,\,n}$ | −1 | $b_{n-k,\,n-k}$ | 1 |
| $b_{n,\,1}$ | 1 | $b_{n,\,n}$ | 1 |

3) When k>2, the procedure in step 2) can be generalized to products starting with $b_{n,q}$, where $2 \le q \le k$. The procedure how each product multiply is chosen is given in (28).

$$b_{n,q} \Rightarrow \begin{cases} b_{q,q+k} & \Rightarrow b_{rem(q+k,n),rem(q+2k,n)} \Rightarrow \ldots \Rightarrow b_{n-k,n} \\ b_{rem(q-k,n),rem(q-k,n)} & \Rightarrow b_{rem(q-2k,n),rem(q-2k,n)} \Rightarrow \ldots \Rightarrow b_{k,k} \end{cases} \quad (28)$$

Similarly, all the diagonal terms are '1's, and all the off-diagonal terms are −1's except $b_{n,q}$. It needs to be noted that, in the analysis of step 2, whether the number 'p' is odd or even does not affect the evaluation of sgn(σ) function. Hence, the products starting with any $b_{n,q}$ is 1, when $2 \le q \le k$.

4) At last, the Leibniz formula sums all the products. In the case of B, each of the '1's in row(n) leads to a product of 1. Therefore, det(a)=det(B)=k.

By now, it is clear that when n and k are not relatively prime, det(A) is zero, or A is invertible; when n and k are relatively prime, det(A) is nonzero, or A is invertible. Therefore, in order to obtain the battery cell voltages from voltage sensor measurements only n's and k's that are relatively prime should be used to design the measurement topology.

The optimal choice of n and k involves tradeoff among many factors. In the later discussion, $n \le 16$ and $k \le 4$ are assumed for practical application. The results are summarized in Table 3.

TABLE 3

|  | n | k |
|---|---|---|
| Increase | Increase noise. | Increase confidence level in fault direction. Increase noise. |
| Decrease | Limit maximum value of k. | Lower voltage measurement range, lower hardware cost. | n: when n is increased, the number of cells that involves in a whole measurement group increases. Thus the noise levels of the calculated cell voltage increases. When n is decreased, since k<n, the maximum value of k is limited.

k: when k is increased, the number of cells one voltage sensor measures increases accordingly. This leads to higher measurement range for each of the voltage sensor, which further results into higher hardware cost and higher noise level. The benefit of increase k is that the CL of sensor fault detection is increased.

A fault-tolerant voltage measurement method is proposed for the BMS of electric vehicles with no extra sensor or software added. A matrix interpretation is developed to simultaneous sensor measurements. The analysis shows the viability of the proposed measurement topology in isolating cell failure and sensor failure by measuring the voltage sum of multiple battery cells. A modified electronic circuit is proposed to implement the proposed measurement topology. Through the use of this concept, the confidence of sensor failure and cell failure detection are greatly improved, while no additional cost is added to the system. Simulation and experiment results show that sensor and cell faults can be identified and isolated by locating the abnormal signals. The robustness of the method is tested by applying UDDS cycles to the cells and no false detection is induced by normal operation behavior.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The present disclosure also relates to an apparatus for performing the operations herein. This apparatus may be specially constructed for the required purposes, or it may comprise a general-purpose computer selectively activated or reconfigured by a computer program stored on a computer readable medium that can be accessed by the computer. Such a computer program may be stored in a tangible computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and operations presented herein are not inherently related to any particular computer or other apparatus. Various general-purpose systems may also be used with programs in accordance with the teachings herein, or it may prove convenient to construct more specialized apparatuses to perform the required method steps. The required structure for a variety of these systems will be apparent to those of skill in the art, along with equivalent variations. In addition, the present disclosure is not described with reference to any particular programming language. It is appreciated that a variety of programming languages may be used to implement the teachings of the present disclosure as described herein.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for detecting a fault condition in a string of battery cells arranged in series, comprising:
    grouping N battery cells into L groups of cells, each group of cells is comprised of a combination of two or more battery cells, each cell is associated with at least two of the L groups of cells, and each combination of battery cells is comprised of battery cells which differ from the other combination of battery cells;
    measuring voltage across each group in the L groups of battery cells using M voltage sensors, such that each voltage sensor of the M voltage sensors measures voltage across a different group of the L groups of battery cells;
    representing cell voltages for each cell in the N battery cells as a matrix, C;
    representing voltage measurements for each group in the L groups of battery cell as a matrix, V;
    representing a mapping between each voltage measurement and the battery cells whose sum corresponds to the voltage measurement in a matrix, A;
    determining current cell voltages using matrix multiplication, wherein the relationship is expressed as V=AC; and
    identifying a fault with one of the M voltage sensors when voltage measure of at least one battery cell in the L groups of battery cells increase while voltage measure of at least one battery cell in the L groups of battery cells decreases.

2. The method of claim 1 wherein determining a fault condition further comprises
    defining one or more relationships between cell voltage for each cell in the N battery cells and the voltage measurements for each group in the L groups of battery cells; and
    determining current cell voltages for each battery cell using the relationships and the voltage measurements for each group in the L groups of battery cells.

3. The method of claim 1 wherein each of the L groups of cells is comprised on K battery cells, where N and K are relative prime numbers.

4. The method of claim 1 wherein determining a fault condition further comprises identifying a fault with one of the N battery cells from two or more of the voltage measurements.

5. The method of claim 4 where a fault with one of the N battery cells is identified by solving $$C_{fault}=C-C_{normal}=A^{-1}V-C_{normal}$$

where is cell voltage values in normal working condition and $C_{fault}$ is the impact of the fault conditions.

6. The method of claim 1 wherein a fault with one of the M voltage sensors is identified by $$V_{fault}=V-V_{normal}=V-AC_{normal}$$

where $V_{normal}$ is a normal sensor reading and $V_{fault}$ is the impact of the fault conditions.

7. A method for detecting a fault condition in a string of battery cells arranged in series, comprising:
    grouping N battery cells into L groups of cells, each group of cells is comprised of a combination of two or more battery cells and each combination of battery cells is comprised of battery cells which differ from the other combination of battery cells;
    measuring voltage across each group in the L groups of battery cells using M voltage sensors, such that each voltage sensor of the M voltage sensors measures voltage across a different group of the L groups of battery cells; and
    representing cell voltages for each cell in the N battery cells as a matrix, C;
    representing voltage measurements for each group in the L groups of battery cell as a matrix, V;
    representing a mapping between each voltage measurement and the battery cells whose sum corresponds to the voltage measurement in a matrix, A; and
    determining current cell voltages using matrix multiplication, wherein the relationship is expressed as V=AC.

8. The method of claim 7 further comprises determining a fault with one of the N battery cells is identified by solving $$C_{fault}=C-C_{normal}=A^{-1}V-C_{normal}$$

where is cell voltage values in normal working condition and $C_{fault}$ is the impact of the fault conditions.

9. The method of claim 7 further comprises determining a fault with one of the M voltage sensors is identified by $$V_{fault}=V-V_{normal}=V-AC_{normal}$$

where $V_{normal}$ is a sensor reading and $V_{fault}$ is the impact of the fault conditions.

10. A battery management system, comprising:
    N battery cells connected in series, where the N battery cells are grouped into L groups of cells, each group of cells having a combination of two or more battery cells, each cell is associated with at least two of the L groups of cells, and each combination of battery cells is comprised of battery cells which differ from the other combinations of battery cells;
    M voltage sensors electrically coupled across the N battery cells, where each voltage sensor of the M voltage sensors is configured to measure voltage across a different group of the L groups of battery cells; and
    a controller electrically coupled to each of the M voltage sensors and operates, in response to voltage measures from the M voltage sensors, to determine a fault condition using the voltage measurements from each group in the L groups of battery cells, wherein the controller determines cell voltages using a relationship expressed as V=AC; where cell voltages for each cell in the N battery cells is represented as a matrix, C; voltage measurements for each group in the L groups of battery cell are presented as a matrix, V; and a mapping between each voltage measurement and the battery cells whose sum corresponds to the voltage measurement is represented in a matrix, A.

11. The battery management system of claim 10 wherein the controller identifies a fault with one of the N battery cells from two or more of the voltage measurements.

12. The battery management system of claim 10 wherein the controller identifies a fault with one of the M voltage sensors when voltage measure of one or more battery cells in the L groups of battery cells increase while voltage measure of another one or more battery cells in the L groups of battery cells decreases.

13. The battery management system of claim 10 wherein the controller identifies a fault with one of the N battery cells by solving $$C_{fault} = C - C_{normal} = A^{-1}V - C_{normal}$$

where is cell voltage values in normal working condition and $C_{fault}$ is the impact of the fault conditions.

14. The battery management system of claim 13 wherein the controller identifies a fault with one of the M voltage sensors by $$V_{fault} = V - V_{normal} = V - AC_{normal}$$

where $V_{normal}$ is a normal sensor reading and $V_{fault}$ is the impact of the fault conditions.

15. The battery management system of claim 10 resides in a vehicle.

* * * * *

UNITED STATES PATENT AND TRADEMARK OFFICE
CERTIFICATE OF CORRECTION

PATENT NO. : 10,903,532 B2  
APPLICATION NO. : 15/750785  
DATED : January 26, 2021  
INVENTOR(S) : Chris Mi et al.

Page 1 of 1

It is certified that error appears in the above-identified patent and that said Letters Patent is hereby corrected as shown below:

In the Claims

At Column 17, Claim 5, Line 62, after "where", insert -- $C_{normal}$ --.

At Column 18, Claim 8, Line 28, after "where", insert -- $C_{normal}$ --.

At Column 18, Claim 9, Line 35, before "sensor", insert -- normal --.

At Column 19, Claim 13, Line 9, after "where", insert -- $C_{normal}$ --.

Signed and Sealed this  
Sixteenth Day of March, 2021

Drew Hirshfeld  
*Performing the Functions and Duties of the*  
*Under Secretary of Commerce for Intellectual Property and*  
*Director of the United States Patent and Trademark Office*